United States Patent [19]

Seidler

[11] Patent Number: 5,601,459
[45] Date of Patent: Feb. 11, 1997

[54] SOLDER BEARING LEAD AND METHOD OF FABRICATION

[75] Inventor: Jack Seidler, Flushing, N.Y.

[73] Assignee: North American Specialties Corporation, Flushing, N.Y.

[21] Appl. No.: 315,204

[22] Filed: Sep. 29, 1994

[51] Int. Cl.$^6$ ....................................................... H01R 4/02
[52] U.S. Cl. ........................................... 439/876; 439/83
[58] Field of Search ..................... 439/83, 876; 228/165, 228/179

[56] References Cited

U.S. PATENT DOCUMENTS

| | | |
|---|---|---|
| 3,780,433 | 12/1973 | Lynch ..................................... 439/83 X |
| 3,864,014 | 2/1975 | Lynch . |
| 3,915,546 | 10/1975 | Cobaugh et al. . |
| 4,302,067 | 11/1981 | Monson et al. . |
| 4,367,910 | 1/1983 | Seidler . |
| 4,605,278 | 8/1986 | Seidler . |
| 4,780,098 | 10/1988 | Seidler .............................. 439/876 OR |
| 4,900,279 | 2/1990 | Dennis ..................... 439/876 |
| 5,030,144 | 7/1991 | Seidler ..................... 439/876 |
| 5,334,059 | 8/1994 | Seidler .............................. 439/876 OR |
| 5,344,343 | 9/1994 | Seidler .............................. 439/876 OR |

*Primary Examiner*—Khiem Nguyen
*Assistant Examiner*—Daniel Wittels
*Attorney, Agent, or Firm*—Darby & Darby, P.C.

[57] ABSTRACT

A solder-bearing lead, and methods of fabricating and using it, where the lead is formed with a solder-retaining portion having a cross-sectional profile with undercuts and a tip, preferably in a V-shape, where solder surrounds said solder-retaining portion and undercuts, and extends outwardly substantially no farther than said tip.

9 Claims, 4 Drawing Sheets

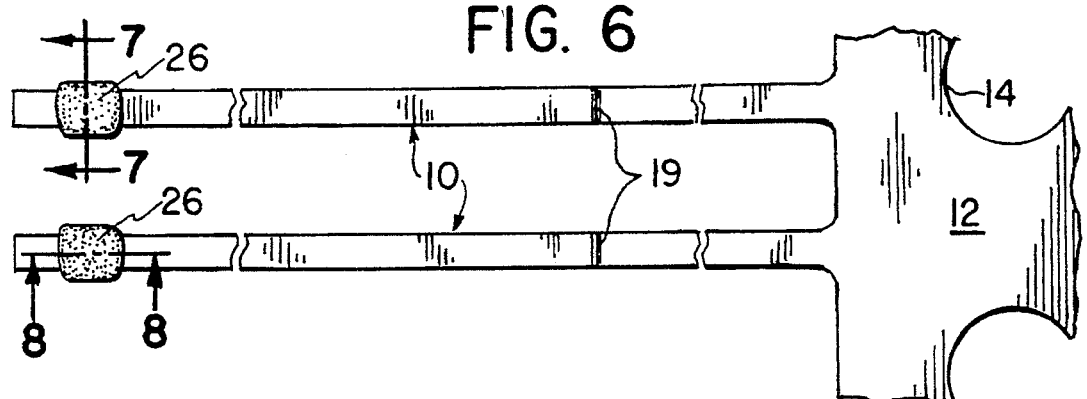
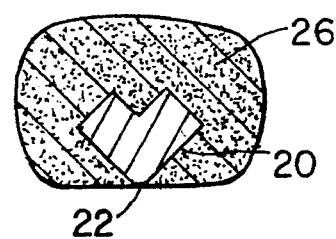
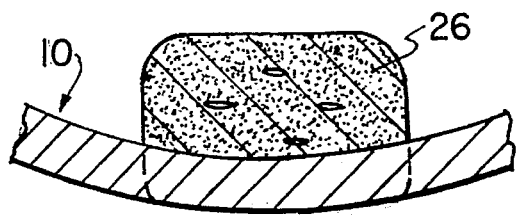
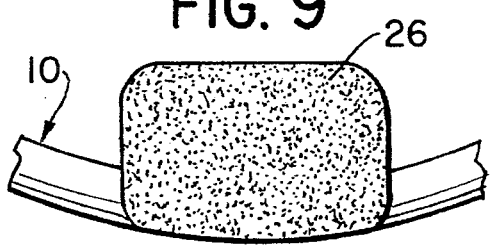
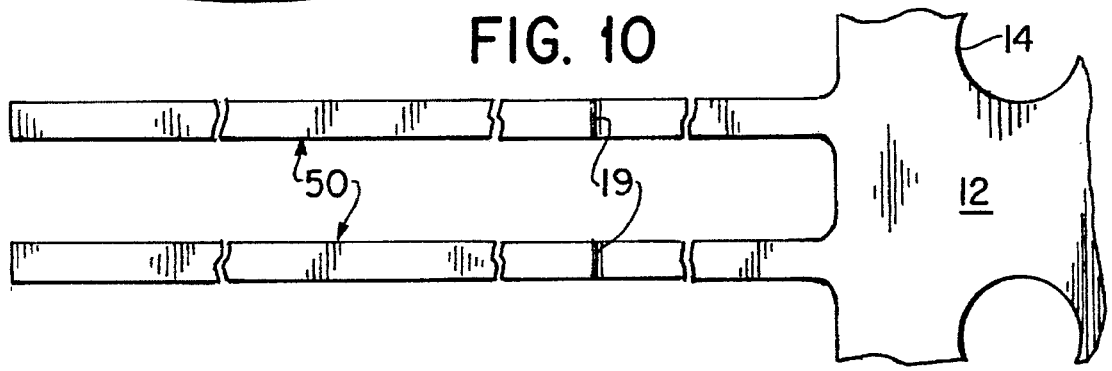
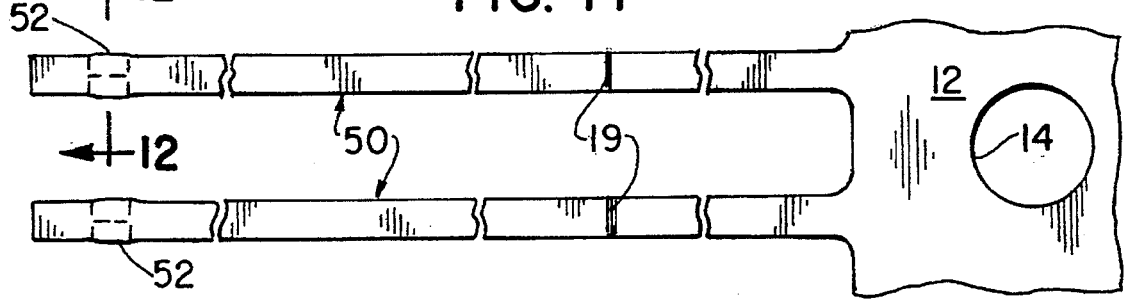

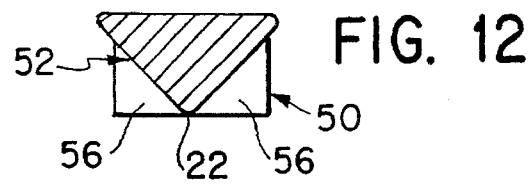
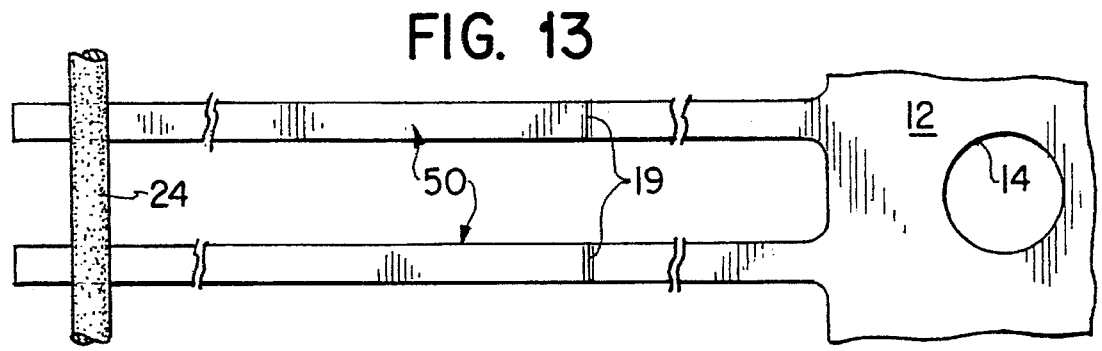
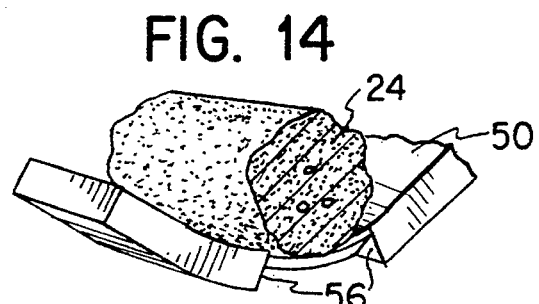
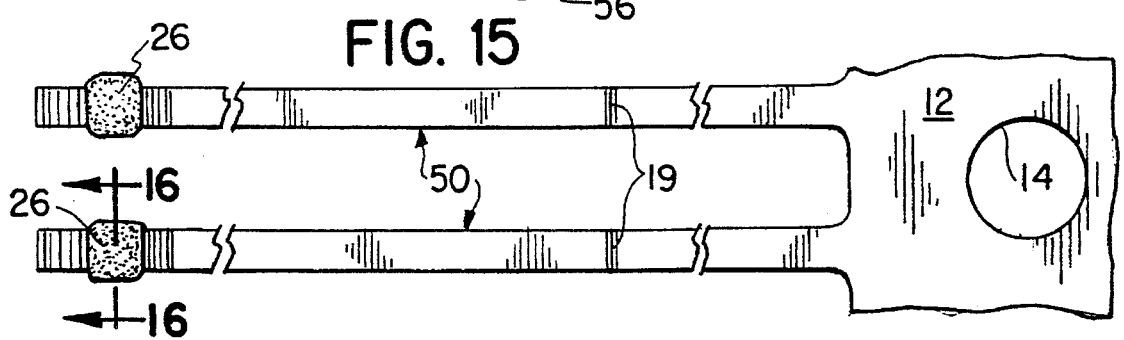
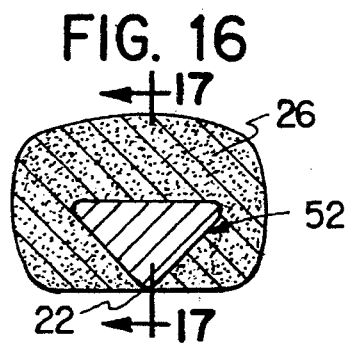
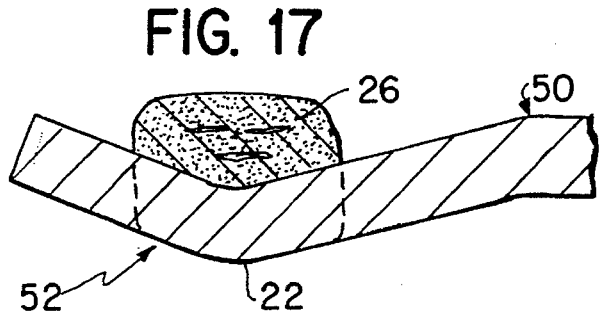

SOLDER BEARING LEAD AND METHOD OF FABRICATION

FIELD OF THE INVENTION

This invention relates to solder-bearing leads for attachment to conductive pads on substrates, such as printed circuit boards, chip carriers, integrated circuits, or the like.

DESCRIPTION OF RELATED ART AND BACKGROUND OF THE INVENTION

In the electronic equipment industry, it is common to provide leads for connection substrates, such as printed circuit boards, chip carriers, and the like, by soldering the leads to conductive pads on the substrate. See, for example, U.S. Pat. No. 4,728,305 issued Mar. 1, 1988 and U.S. Pat. No. 5,030,144 issued Jul. 9, 1991. Such substrates commonly have a row of conductive pads or contact areas along one or more edges, for connection to an array of generally parallel leads spaced correspondingly to the pad spacing. The leads are commonly connected at one end to a longitudinally extending carrier strip, so that a section of the carrier strip having a ganged array of leads extending from it, may be applied to the row of pads along one edge of the substitute for simultaneously soldering the ganged array of leads to the row of pads.

The trend in this industry has been towards greater and greater miniaturization. As a result, the spacing between conductive pads of a substrate has been progressively reduced. While a pitch of 0.100 inch (that is, 10 pads to the inch) has been common, the industry is moving more and more toward smaller pitches, such as 0.075 or 0.050 inch or even less. This requires a corresponding reduction of spacing and size of leads which are to be connected to such conductive pads.

In satisfying such needs for reduced spacing between leads, sufficient spacing must be nevertheless provided between the leads to prevent inadvertent contact or arcing between adjacent leads. This must be done without sacrificing accuracy in manufacture or impeding rapid assembly of multiple leads. A particular problem arises where the leads are solder-bearing, since in some instances the arrangement for holding the solder to the lead may encroach into the space between leads, thereby limiting how closely the leads may be spaced. See for example said U.S. Pat. No. 4,728,305.

Accordingly, a need exists for solder-bearing leads of reduced size and spacing which are effectively applicable to accommodate reduced size and spacing of substrate conductive pads, but sufficiently spaced to prevent arcing, and to provide methods of manufacturing such leads without sacrificing accuracy.

SUMMARY OF THE INVENTION

The present invention overcomes some of the problems and deficiencies of the prior art by providing solder-bearing leads of reduced size and spacing to accommodate the desired reductions in spacing of contact pads on substrates. Closer spacing of leads is attainable by eliminating lateral extensions of the leads which may intrude into the space between leads, and thus limit permissible spacing of such leads. In addition, At the same time, provision is made for effectively retaining one or more solder beads or slugs on each lead, without unduly intruding into the space between leads to such an extent as to prevent close spacing of leads. In addition, provision is made to maintain direct metal-to-metal contact between lead and pad during soldering so that re-flow of the solder will not disturb the relation between lead and pad, and will provide a good solder joint.

The solder-bearing lead of the invention can be used, among other ways, as an edge clip for mounting to the edge of a substrate, or for surface mounting on a substrate. It can advantageously be made by automatic progressive stamping of blanks at high speed, in a continuous ganged array of leads held on one or more carrier strips, suitable for rolling up on a reel for convenience of transportation and ease of use in assembly to a chip carrier or other substrate.

The objects, features, and advantages of the present invention will be more completely understood by referring to the following detailed description of presently preferred embodiments of the present invention, taken with the attached drawings.

BRIEF DESCRIPTION OF THE DRAWINGS

FIG. 6 is a plan view similar to FIG. 5 after the solder wire is cut and formed around the solder location.

FIG. 7 is an enlarged fragmentary transverse cross-sectional view of one lead of FIG. 6 viewed along line 7—7 thereof.

FIG. 8 is an enlarged fragmentary longitudinal cross-sectional view of a lead of FIG. 6, viewed along line 8—8 thereof.

FIG. 9 is an enlarged fragmentary side elevation view of the lead of FIGS. 6 to 8.

FIG. 10 is a plan view of a fragment of a continuous strip of ganged leads according to a modified form of the invention, at an early stage of fabrication, with excess portions cut away to leave an array of lead blanks secured to a carrier strip.

FIG. 11 shows a plan view similar to FIG. 10 after a further fabrication step.

FIG. 12 is an enlarged cross-section view of a lead of FIG. 10, showing how the cross-section is reformed for accepting a solder bead.

FIG. 13 shows a plan view similar to FIG. 11 of a further stage in the fabrication of the leads according to the present invention, by laying a solder wire across a section of the array of leads of FIG. 11.

FIG. 14 is an enlarged perspective view showing the relation of the solder wire to a lead in FIG. 13.

FIG. 15 is a plan view of a section of the array of leads of FIG. 13, after the solder wire is cut and formed around the solder location, of the lead.

FIG. 16 is an enlarged transverse cross-sectional view of a lead of FIG. 15 viewed along line 16—16 thereof.

FIG. 17 is an enlarged longitudinal cross-sectional view of the solder bearing portion of a lead of FIG. 15 or 16, viewed along line 17—17 of FIG. 16.

DETAILED DESCRIPTION OF PREFERRED EMBODIMENTS

Figure 1:
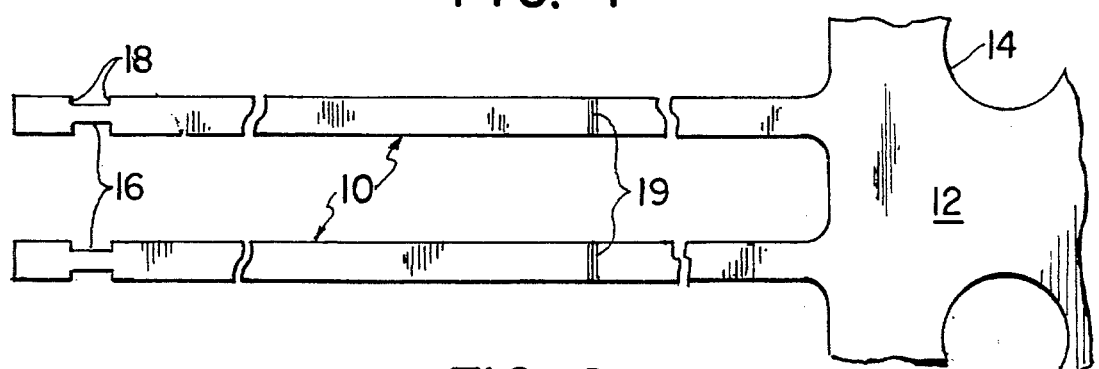
FIG. 1 is a plan view of a portion of a continuous strip having a ganged array of lead blanks, each integral with a carrier strip, and useful in the present invention.

Referring now to the drawings, where like reference numerals represent corresponding parts in the several views, FIGS. 1 to 9 show a first form of the invention. A continuous flat uniform slightly resilient strip of electrically conductive material (such as beryllium copper, brass or phosphor bronze, any of which may be pre-plated with solder or tin) of uniform thickness and width is passed through a progressive stamping machine to cut out extraneous materials, leaving a stamped strip illustrated in FIG. 1, having a sequence of side-by-side individual lead blanks 10 joined integrally at one end to a carrier strip 12. As is customary, the carrier strip 12 may include periodically spaced holes 14 for indexing the strip through automatic stamping apparatus. In this form of the invention, at the position where a solder bead is to be held on the lead, each lead blank 10 has a reduced-width section 16. This section 16 is located along lead 10 at a position, depending upon the ultimate configuration of lead 10, where it is desired to retain a solder mass or bead. This reduced-width section 16 is joined to the main lead blank 10 by shoulders 18 at each end of section 16, which, as will be seen below, form stops or holding means to prevent longitudinal movement of the solder bead along the lead 10. At an appropriate position along each lead 10, it is provided with a transverse scoring or notch 19 which permits the lead 10 to be broken or cut away from the carrier strip 12.

Figure 2:
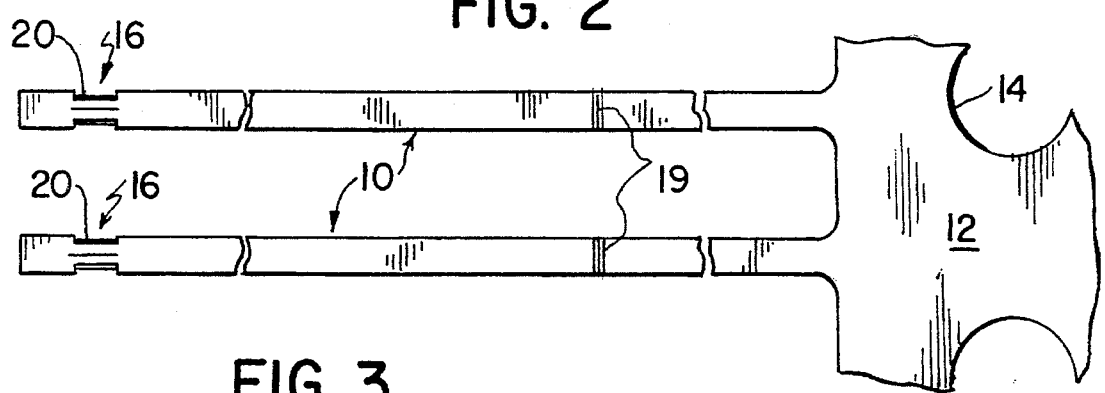
FIG. 2 is a similar plan view of the arrangement of FIG. 1, after subsequent forming operations at the intended solder location.
Figure 3:
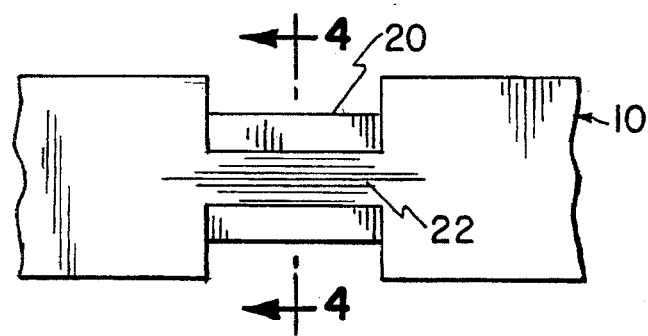
FIG. 3 is an enlarged fragmentary plan view of a portion of one lead shown in FIG. 2.
Figure 4:
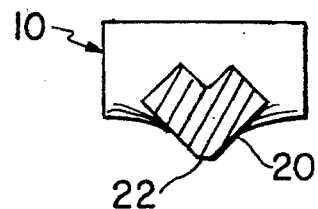
FIG. 4 is a cross-sectional view of the structure of FIG. 3, taken along line 4—4 thereof.

According to the invention, the reduced-width section 16 is formed, as by stamping or pressing along its center line 21, into a generally V-shaped cross-section 20 illustrated in FIGS. 2 to 4. The apex 22 of each V structure 20 projects slightly below the under surface of its lead 10 as shown most clearly in FIG. 4.

Figure 5:
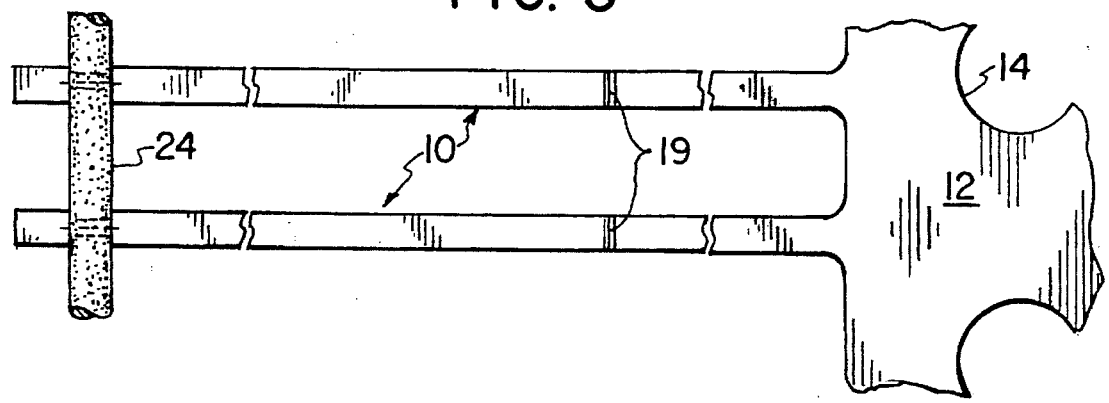
FIG. 5 is a view similar to FIG. 2, after placing a solder wire across a section of the array of leads.
Figure 18:
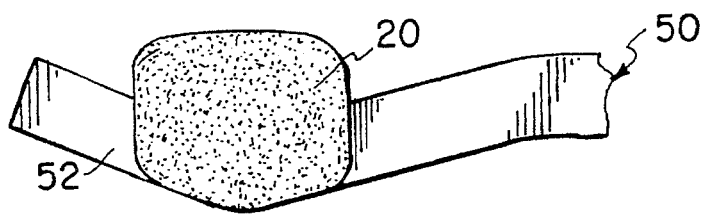
FIG. 18 is an enlarged fragmentary side elevation view of lead of FIGS. 15 to 17.

In a subsequent step of the process of fabrication, the lead is bent slightly, to form an obtuse angle, at the position of the reduced-width section. Then a solder wire or rod 24 is laid across a number of leads at the locations of their reduced-width sections 16, as illustrated in FIG. 5. Preferably the solder wire 24 contains a rosin core forming a solder flux. In a subsequent operation, the solder wire 24 is severed on each side of the reduced-width section 20 and then formed around the V-shaped section 20 as illustrated in FIGS. 6 to 9 to form a solder bead. It will be recognized that the solder material is highly malleable and therefore lends itself readily to such forming around the V-shaped section 20. As shown in FIG. 7, the width of the formed solder mass or bead 26 transverse to the lead 10, may be made substantially equal to or only slightly wider than the width of lead 10, so that the 26 encroaches only slightly or not at all into the space between successive leads 10, thereby permitting the leads to be closely spaced to conform to the substrate conductive pad spacing, which therefore may be substantially less than the conventional spacing of 0.050 inch. By appropriately selecting the diameter or cross-section of the solder wire 24, the height of the solder bead 26 may be made as large as necessary to provide the correct amount of solder for the proper solder joint to be made between each lead and its corresponding conductive pad.

As seen in FIG. 7, the solder 26 is caused to surround the V-shaped section 20 while not covering the apex 22. Also, the undercut provided by sloping sides of the V-shaped cross-section provides an interlock with the solder mass to prevent its accidental removal transversely of the lead 10, while the shoulders 18 serve to prevent longitudinal movement of the solder bead along the lead 10, so that the bead is retained reliably at the desired position.

Figure 19:
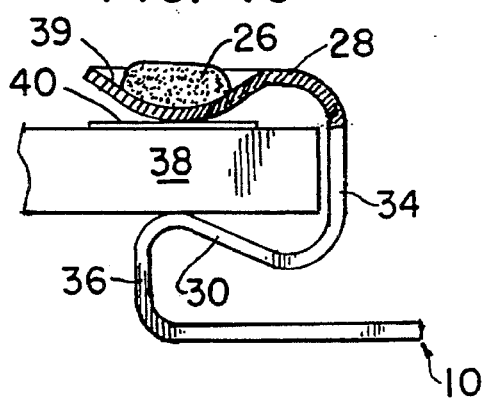
FIG. 19 is a side elevation view partly in section of a substrate on which is mounted an edge clip having on one leg a solder mass formed as in FIGS. 1 to 9, preliminary to re-flow of the solder.

One form which a completed lead may take is shown in FIG. 19, having a generally S-shaped configuration. This configuration is formed by three generally parallel legs 28, 30, 32, with legs 28 and 30 joined by an appropriately shaped joining section 34, preferably curved in whole or in part, and legs 30 and 32 are also joined by a similar section 36. This configuration is adapted to receive a substrate 38 between upper leg 28 and central leg 32 of the S-shaped configuration, thereby providing a resilient clip mounting for the substrate 38 and reducing potentially harmful effects on the soldered joint which may be created by shock, vibration or differential thermal expansion.

The substrate 38 (which may be a chip carrier or an integrated circuit or a printed circuit board or the like) carries along one or more edges the usual linear array of conductive pads or contacts 40. In assembling clip leads such as in FIG. 19 to the substrate, a section of the carrier strip having a number of ganged leads 10 equal to the number of conductive pads 40 along an edge of the substrate, is cut off, and the clip-like arrangement of FIG. 19 is mounted on the substrate, with the solder mass 26 of each lead in contact with a corresponding substrate contact 40. The apex 22 of the lead's V-shaped section 20 then makes direct metal-to-metal contact with the conductive pad 40, with no solder in between. This provides the advantage that the lead 10 and pad 40 are readily maintained in desired fixed relation during soldering, which is not altered by subsequent re-flow or melting of the solder. The sloped outer end of the V-shaped section 26 and the adjoining flat portion 39 of lead 10 serve as a ramp or slope to facilitate entry of the substrate 38 between the legs 28 and 30.

While FIG. 19 shows a single solder bead, on one leg 28, it will be understood that one or more additional solder beads may be mounted on lead 10, in a fashion similar to bead 26. For example, a second similar solder mass may be formed on leg 30, as shown in FIG. 20, so as to permit soldering each lead 10 to conductive pads 44 on opposite faces of the substrate 38.

Figure 20:
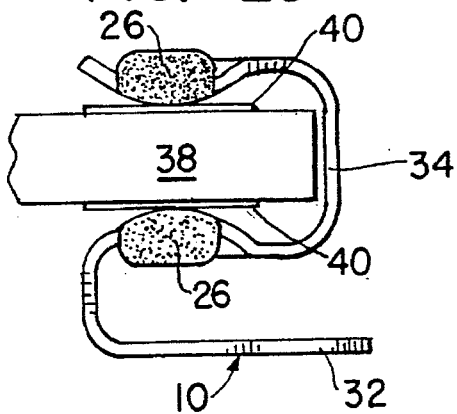
FIG. 20 is a side elevation view similar to FIG. 19, but having two solder masses, one on each face of the substrate.

The leg 32 of the arrangement of FIG. 19 and 20 may be surface-mounted on a second substrate by a similar solder retaining arrangement (or any other soldering arrangement)

on leg 32, or leg 32 may be extended to form a terminal for connection to order apparatus. For example, leg 32 may be bent at right angles to the position shown, and shaped to extend through a hole in a second substrate for perpendicular mounting and soldering to the second substrate.

Figure 21:
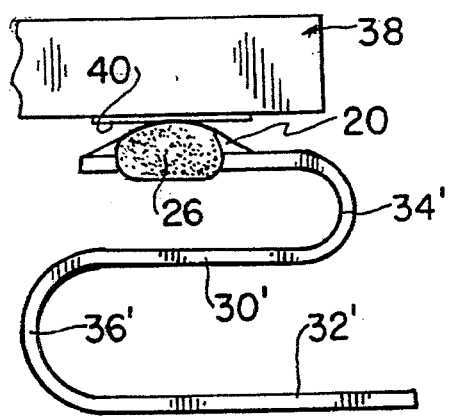
FIG. 21 is a side elevation view of a substrate positioned on an S-shaped lead of FIGS. 1 to 9.

FIG. 21 shows another arrangement, with lead 10 formed generally similarly to that of FIG. 19, but arranged to be soldered to a conductive pad 40 with the substrate on top of the lead 10 and solder bead 26.

Figure 22:
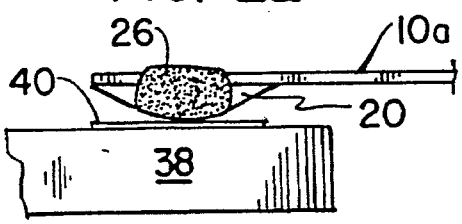
FIG. 22 is a side elevation view of a substrate with a lead of FIGS. 1 to 9 positioned to be surface mounted thereon.

Instead of forming a clip as in FIG. 19 or 20, the lead of the invention may be directly surface-mounted on a substrate by soldering the solder-bearing section to a substrate as shown in FIG. 22. The other end 10*a* of lead 10 may have any desired configuration, as required by apparatus to which it is to be connected.

Figure 23:
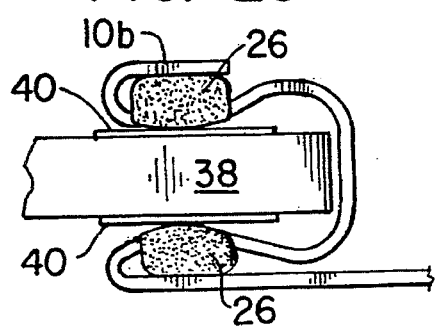
FIG. 23 is a side elevation view similar to FIG. 20, with provision for extra security for retaining the solder mass on its lead.

In some instances, it may be desirable to give added security for retention of the solder on the lead, in any of the above-described forms of the invention. This may be done as shown in FIG. 23, which shows an edge clip similar to FIG. 20. Here, the lead portion 10*b* extending longitudinally outward from the solder bead 26 is bent over and closely juxtaposed to the solder 26 to further prevent movement of the solder mass away from lead 10. In addition, lower leg 32 of the lead 10 is bent to be close to the lower solder mass 26*a*, to aid in retaining it on the lead, if needed.

While the undercuts for retaining the solder mass on the lead are shown in FIGS. 1 to 9 as formed by bending the lead body into a V-shape about a longitudinal axis, it will be understood that other ways of providing the undercuts and apex may be used. Thus, FIGS. 10 to 18 illustrate stages in the fabrication of a modified form of the present invention. FIG. 10 shows the lead blanks formed by cutting out suitable portions of a continuous strip of conductive material to leave an array of flat leads 50 of uniform width attached at one end to and integral with the carrier strip 12. Instead of forming the V-shaped section as shown in FIGS. 1 to 9, at the location of each lead where the solder lead is to be applied the lead is coined into a V-shape as shown in FIGS. 11 and 12. This is done by applying pressure to the somewhat malleable lead, without removing material. The material formerly in the corners 54 of the leads 50 is moved away by this operation so that the width of the coined V-shaped section will be slightly larger than the original width of the leads 50, as seen in FIG. 12, or the upper surface of the lead may bulge upward. Shoulders indicated at 56 in FIG. 14 are formed at the ends of the coined section 58. While shown as squared off, these shoulders may be somewhat rounded or tapered. After thus forming the leads with a Section 52 having a V-shaped cross-section, again a solder wire 20, preferably rosin-cored, is laid transversely of the leads 50 at the position of the V-shaped section 52, as shown in FIG. 13 and in perspective view in FIG. 14. The solder material is then again molded around the V-shaped coined section 56, as seen in transverse cross-section in FIG. 16 and in longitudinal cross-section in FIG. 17. Here again, as in the preceding form, the solder 20 does not extend substantially beyond apex 22 of the V, to allow the apex 22 to be placed in direct contact with a mating conductive pad.

By forming the solder 20 around the lead 50 at the coined V-shaped section 52, the solder bead 20 is retained against transverse movement by the undercut provided by the inwardly sloping sides of the V-shaped section, and the shoulder 56 at each end of the V-shaped section retains the solder bead against longitudinal movement. Again, the width of the solder bead 20 may be made equal to or only slightly wider than the width of the lead 10 or 50, so that in this arrangement as well as in the previously described one, leads may be relatively close together, since little if any portion of the leads extends into the space between the leads.

Figure 24:
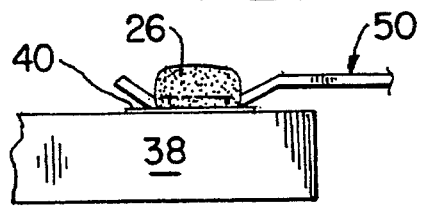
FIG. 24 is a side elevation view similar to FIG. 20 showing a lead as in FIGS. 10 to 18 positioned on a substrate.

Thus, by the simple process of coining the V-shaped section instead of bending the lead into a V-shaped section, a similar profile is obtained, useful in the same way as described above, including FIGS. 19 to 23. The solder-retaining arrangement described above with respect to FIGS. 10 to 18 may thus be used in place of the arrangements of FIGS. 1 to 9 described with respect to FIGS. 19 to 23. FIG. 24 shows, in a fashion similar to FIG. 22, how each lead 50 with a solder bead 26 formed about a coined V-shaped section 52 may be positioned relative to a conductive pad 40 of a substrate 38, for soldering. As before, the lead body 50 may be formed as described into a variety of shapes known to the art, including edge clips or for surface-mounting, shown in FIGS. 19 to 23.

In assembling the leads to a chip carrier or other substrate having a row of contact pads along one or more edges, a section of the carrier strip is cut off, the section including a number of leads corresponding to the number and spacing of contacts on the substrate. While held together by the carrier strip, the leads are positioned in contact with the respective pads, so that the apex of the undercut portion of each lead makes direct contact with the corresponding pad. The ganged array of leads may be held against the pads by the resilience of the clip arrangement when a configuration as in FIG. 19 is used. Otherwise the leads and pads may be held in position by suitable fixtures. The solder is then re-flowed, and then cooled, which joins each lead to a pad both electrically and mechanically. Thereafter the carrier strip is severed or broken away, as by the notch construction 19. The other ends of the leads may then be connected suitably to other devices.

By way of example, the leads of the present invention may be spaced more closely even then the present general minimum pitch of 0.050 inch (20 to the inch). As an illustration (but not limitation) of the miniature dimensions attainable with the present invention, each lead may have a width of 0.010 to 0.015 inch, with a thickness of 0.005 to 0.008 inch. The reduced-width section 16 of FIGS. 1 to 9 may be between 0.005 and 0.008 inch wide and 0.010 to 0.012 inch long. The apex 22 of the V-shaped section 20 in FIGS. 1 to 9 may project below the lead under surface by 0.001 to 0.003 inch. Corresponding dimensions may be used for the form of FIGS. 10 to 18. Therefore, pitches of as small as 0.040 to 0.025 inch (25 to 40 leads per inch) may be provided without creating short circuits between the leads or after soldering between the conductive pads to which they are soldered.

It will be understood that, while the V-shaped profile of the solder-retaining section is a simply attainable and a desirable form, other profiles may be used. The present invention provides for interlocking or retaining the solder bead to the lead without preventing metal-to-metal contact between lead and its corresponding conductive pad or contact. Thus, without departing from essential aspects of the invention, the V-shaped profile may be modified to have a curved form or a stepped form. Also the solder-retaining section profile may be formed in other ways, as by suitably removing materials from the lower corners of the edges of the leads to provide the desired undercut, and apex or tip.

It will be understood that the invention is not to be limited by the specific embodiments shown in the drawings and described in the above description, which are given by way of example and not of limitation, but only in accordance with the scope of the appended claims.

What is claimed is:

1. A connector arrangement for a substrate having a row of conductive pads, comprising:

a carrier strip of electrically conductive material of substantially uniform thickness, a plurality of elongated conductive leads, each integrally connected to said carrier strip at one end of the lead, said leads being parallel and spaced corresponding to said pads, each lead comprising:

a generally flat body portion of substantially uniform width and thickness, with an upper surface and a lower surface, a longitudinally extending solder-bearing portion at a predetermined position along said lead adjoining said flat body portion and having a cross-section with undercuts at the edges of said solder-bearing portion, an interior portion of said cross-section having a tip extending at least to the same extent as the lower surface of said adjoining flat body portion, a shoulder between said solder-bearing portion and said flat body portion at an end of said solder-bearing portion, and a solder mass mechanically formed about said solder-bearing portion, and extending around said undercuts and substantially to said tip, said solder mass formed at a temperature below the melting point of said solder mass, whereby said solder mass is prevented from longitudinal movement by said shoulder and from transverse movement by said undercuts, and said lead may be soldered to a corresponding pad by placing said tip in contact with said pad and reflowing said solder mass.

2. A connector arrangement as in claim 1, in which said solder-bearing portion has a generally V-shaped profile in cross-section, with the vertex of said V-shaped profile extending transversely at least to the lower surface of said flat body portion.

3. A connector arrangement as in claim 1, where said tip extends beyond the under surface of said flat body portion.

4. A connector arrangement as in claim 1, wherein said solder-bearing portion is narrower than said lead body portion and is bent about a longitudinal axis to form said undercuts and said tip.

5. A connector arrangement as in claim 2, wherein said vertex is substantially co-planar with said lead body lower surface and said solder mass.

6. A connector arrangement as in claim 2, wherein said vertex extends beyond said lead body lower surface and solder mass.

7. A solder-bearing lead for connection to a substrate conductive pad comprising an elongated lead body of electrically conductive material, said lead body having substantially uniform width and thickness with an upper surface and a lower surface, said lead body having a longitudinally extending solder-bearing portion at a predetermined position along said lead body and adjoining a uniform thickness section of said lead body, said solder-bearing portion having a cross-section with undercuts at the edges thereof and an interior portion with a tip extending at least to the same extent as said lead body lower surface, said lead having a shoulder between said uniform thickness body section and said solder-bearing portion, and a solder mass mechanically formed about said solder-bearing lead portion and extending around said undercuts, but not extending substantially beyond said tip, said solder mass formed at a temperature below the melting point of said solder mass, whereby said solder mass is prevented from longitudinal movement by said shoulder and from transverse movement by said undercuts, and said lead may be soldered to a corresponding pad by placing said tip in contact with said pad and reflowing said solder mass.

8. A solder-bearing lead as in claim 7, wherein said solder-bearing lead portion has a V-shaped cross-section, said undercuts being provided by the sloping sides of said V and said tip being the vertex of said V.

9. A lead as in claim 8, wherein said vertex extends beyond said lead body lower surface.

* * * * *